United States Patent [19]

Seita et al.

[11] Patent Number: 5,527,718
[45] Date of Patent: Jun. 18, 1996

[54] PROCESS FOR REMOVING IMPURITIES FROM POLYCIDE ELECTRODE AND INSULATING FILM USING HEAT

[75] Inventors: Hisaharu Seita; Kazuhiro Tajima, both of Kanagawa, Japan

[73] Assignee: Sony Corporation, Tokyo, Japan

[21] Appl. No.: 365,416

[22] Filed: Dec. 28, 1994

[30]   Foreign Application Priority Data

Dec. 28, 1993   [JP]   Japan ................................. 5-338396

[51] Int. Cl.$^6$ ............................................. H01L 21/306
[52] U.S. Cl. ........................... 437/11; 437/10; 437/12; 437/13; 437/937
[58] Field of Search ............................. 437/10, 11, 12, 437/13, 937

[56]            References Cited

U.S. PATENT DOCUMENTS

| | | | |
|---|---|---|---|
| 3,923,559 | 12/1975 | Sinha | 437/937 |
| 4,561,171 | 12/1985 | Schlosser | 437/10 |
| 5,273,920 | 12/1993 | Kwasnick et al. | 437/40 |
| 5,364,803 | 11/1994 | Lur et al. | 437/40 |
| 5,393,686 | 2/1995 | Yeh et al. | 437/45 |

FOREIGN PATENT DOCUMENTS

| | | | |
|---|---|---|---|
| 0109323 | 7/1982 | Japan | 437/937 |
| 0137218 | 8/1983 | Japan | 437/937 |

OTHER PUBLICATIONS

H. Komatsu, et al., "Restraint of W—Polycide Gate Capacitance Decrease," Journal of the Japanese Society of Applied Physics, Fall 1988, p. 616.

*Primary Examiner*—Tom Thomas
*Assistant Examiner*—Lynne A. Gurley
*Attorney, Agent, or Firm*—Hill, Steadman & Simpson

[57]            ABSTRACT

A process for producing a semiconductor device which includes a step of drawing out the impurities contained in the electrode film and/or insulating film and contributing to the growth of the insulating film before the heat treatment for activating the electrode film. The step of drawing out the impurities is a step of preliminary heat treatment at a temperature at least the film-forming temperature of the electrode film and no more than the growth temperature of the insulating film. The preliminary heat treatment is preferably performed at a temperature of 450° C. to 800° C., more preferably 450° C. to 700° C. The preliminary heat treatment may be performed after the formation of the electrode film or may be performed during the formation of the electrode film after each formation of one or more thin film layers for forming the electrode film.

15 Claims, 5 Drawing Sheets

PROCESS FOR REMOVING IMPURITIES FROM POLYCIDE ELECTRODE AND INSULATING FILM USING HEAT

BACKGROUND OF THE INVENTION

1. Field of the Invention

The present invention relates to a process for producing a semiconductor device including a step for forming an electrode film on an insulating film. More particularly, the invention relates to a process for producing a semiconductor device enabling the insulating film to be made thinner.

2. Description of Related Art

The degree of miniaturization accompanying the scaling down of VLSI-MOS devices is limited only by the advances made in photolithography and other miniaturization techniques and has accordingly proceeded at a tremendous pace. There is said to be no limit to the reduction of size of transistors down to 0.1 μm gates.

Accordingly, the gate insulating film is being made increasingly thinner with each generation. In 0.35 μm rule devices, use is being made of gate insulating films of a thickness of about 10 nm. A double-layer film of a polycrystalline silicon film and tungsten silicide film ($WSi_x$, wherein x is 2.2 to 2.8), that is, a so-called "polycide film", is generally superposed on the gate insulating film as a gate electrode film. It is known that when forming a tungsten silicide ($WSi_x$) film, fluorine enters into the tungsten silicide ($WSi_x$) film due to the use of silane gas and $WF_6$ gas.

In this gate insulating film, however, it has also been known that if no special treatment is applied and the thickness is increased by natural oxidation by about 1 to 2 nm, an increase occurs in the thickness due to the enhanced oxidation based on the fluorine in the tungsten silicide film and it therefore is not possible to accurately control the thickness of the gate insulating film.

For example, as shown in FIG. 5A, if a sample prepared by depositing a polycrystalline silicon film on a silicon oxide film and then depositing a tungsten silicide ($WSi_x$) film on it using $SiH_4+WF_6$ is measured for the concentration of fluorine just after deposition by a secondary ion mass spectrometer (SIMS), it is found that the distribution in the tungsten silicide ($WSi_x$) film is uniform at a high concentration. If the sample is heat treated at a high temperature of 950° C. and then analyzed by a secondary ion mass spectrometer (SIMS), then, as shown in FIG. 6A, it is found that fluorine is taken in at the interface between the silicon oxide film and the polycrystalline silicon film. This fluorine causes enhanced oxidation of the silicon oxide film.

It was also known that if a high concentration of fluorine is contained in the gate electrode film ($1\times10^{21}$ atoms/cm$^2$), the high temperature (700° C.) annealing treatment used for lowering the resistivity, performed after the formation of the gate electrode film, causes the fluorine to rapidly escape as a gas and causes peeling of the gate electrode film by cracking the film.

Along with the miniaturization of devices, film-forming equipment has become larger in size as well. Film-forming apparatuses which form films at speeds 10 times that of the prior art have also been developed. If a tungsten silicide ($WSi_x$) film is formed by such a 10-times faster film-forming apparatus, then two to three times the concentration of fluorine ends up being contained in the gate electrode film compared with the prior art and there is accordingly a greater increase of the thickness of the gate insulating film (growth of lower oxide layer) and a greater chance of peeling, so improvement has been required.

Inventors of the present application proposed to enable reduction of the concentration of fluorine in the tungsten silicide ($WSi_x$) film to ½ to ¹⁄₁₀ that of the prior art by formation of the tungsten silicide ($WSi_x$) film by a dichlorosilane (DCS)+$WF_6$ gas and a film-forming temperature of 650° C. (fall of 1988, Journal of the Japanese Society of Applied Physics, p. 616). We found that by using this tungsten silicide ($WSi_x$) film for a polycide structure gate electrode film, it is possible to suppress the enhanced oxidation by fluorine and as a result possible to suppress the reduction in capacitance of the gate insulating film, prevent a reduction in the voltage resistance, and thereby prevent a reduction in reliability.

For example, as shown in FIG. 5B, if a sample prepared by depositing a polycrystalline silicon film on a silicon oxide film and then depositing a tungsten silicide ($WSi_x$) film on it using a dichlorosilane (DCS)+$WF_6$ gas is measured for the concentration of fluorine just after deposition by a secondary ion mass spectrometer (SIMS), it is found that the concentration of fluorine in the tungsten silicide ($WSi_x$) film falls, as shown in FIG. 5B, compared with the case shown in FIG. 5A. Further, the results of analysis by a secondary ion mass spectrometer (SIMS) of a sample heat treated at a high temperature of 950° C. are shown in FIG. 6B. As shown in FIG. 6B, compared with the case shown in FIG. 6A, the amount of fluorine taken into the silicon oxide film is also reduced.

In this method, however, there is a high temperature reliance and vacuum reliance at the time of film formation and the reproducibility and uniformity become poorer as compared to the case of formation of the tungsten silicide ($WSi_x$) film using monosilane, so use of this for actual processes for production becomes difficult.

On the other hand, a process for production of a tungsten silicide ($WSi_x$) film using a conventional silane type gas in which the film-forming temperature is reduced to about 360° C. to 450° C. to try to reduce the residual fluorine has been prepared, but it is not possible to sufficiently control the gas phase reaction and therefore it is difficult to obtain a tungsten silicide ($WSi_x$) film at a practical manufacturing yield.

Further, proposal has been made to raise the temperature of the substrate before the film formation and then form a tungsten silicide ($WSi_x$) film, but practical film-formation conditions have not been obtained.

For miniature gate electrodes, it has been proposed to eliminate these problems by making the gate electrodes of just a polycrystalline silicon film, but this ends up running counter to the miniature gates, for which high speed operation is desired, so that the number of interconnection layers would increase and the manufacturing costs rise.

At the present time, gate insulating films are becoming thinner than 8 nm and therefore there are problems in reliability of the voltage resistance.

SUMMARY OF THE INVENTION

The present invention has been made in consideration of the above situation and has as its object the provision of a process for producing a semiconductor device in which an electrode film is formed on an insulating film such as with a miniature MOS transistor, wherein it is possible to prevent the insulating film from enhanced oxidation after formation of the electrode film and the occurrence of the phenomenon of film peeling and form a thin insulating film with a high precision and good quality.

The process for producing a semiconductor device according to the present invention comprises steps of forming an electrode film on an insulating film and drawing out the impurities which are contained in the electrode film and/or insulating film and contribute to the growth of the insulating film before the heat treatment for activating the electrode film.

The step of drawing out the impurities is preferably a step of preliminary heat treatment at a temperature no less than the film-forming temperature of the electrode film and no more than the growth temperature of the insulating film. The preliminary heat treatment is preferably performed at a temperature of 450° C. to 800° C., more preferably 450° C. to 700° C.

The preliminary heat treatment is preferably performed in a gaseous atmosphere including any one of hydrogen, silane, and polysilane.

The preliminary heat treatment is preferably performed at a pressure of from atmospheric pressure to a vacuum.

The step of drawing out the impurities may also be a step of plasma treatment of the surface of the electrode film by using of any one gas of hydrogen, silane, and polysilane.

The step of drawing out the impurities may be performed after the formation of the electrode film or may be performed during the formation of the electrode film after each formation of one or more thin film layers for forming the electrode film.

As the electrode film, it may be made of a gate electrode film, which may be comprised for example of a multilayer film of a polycrystalline silicon film and silicide film, that is, a "polycide film". The silicide film is not particularly limited, but for example may be tungsten silicide, titanium silicide, cobalt silicide, or molybdenum silicide. These silicides sometimes include fluorine as an impurity during the film-forming process. The process of the present invention draws out the fluorine included in the silicide film before the heat treatment for activating the electrode film.

As the insulating film, it may be made of a gate insulating film. This gate insulating film may be comprised of a silicon oxide film obtained by thermal oxidation of the surface of a semiconductor substrate etc.

In the process for producing a semiconductor device according to the present invention, the fluorine and other impurities taken in during the process of formation of the electrode film are drawn out before the heat treatment for activation of the electrode film (for example, treatment at over 800° C.). Accordingly, it is possible to efficiently prevent fluorine and other impurities being taken in at the interface with the insulating film at the time of heat treatment for activation of the electrode film. As a result, there is no longer any enhanced oxidation of the insulating film due to fluorine and other impurities and it is possible to prevent the increase in thickness of the insulating film.

Since it is possible to prevent an increase in thickness of the insulating film after the formation of the electrode film, it is possible to maintain the thickness of the insulating film during its formation, and it is easy to control the thickness of the insulating film during its formation. It is easy to control the thickness of the insulating film, and it is possible to form the insulating film with a high precision. Further, for the same reasons, it is possible to maintain the thickness of the insulating film at the time of forming a good quality film (one superior in voltage resistance), so the voltage resistance can be improved and an insulating film superior in reliability can be formed.

Further, since there is no longer escape of fluorine and other impurities as a gas at the time of heat treatment for activation of the electrode film, it is possible to prevent the phenomenon of peeling of the electrode film. As a result, it is possible to reduce the manufacturing defects and therefore to expect a higher manufacturing yield.

In addition, since it is possible to form the electrode film by the CVD method using a monosilane type gas rather than using dichlorosilane etc., it is possible to produce the electrode film stably at a high quality.

The other aspect of the present invention, which draws out the impurities during the formation of the electrode film, after each formation of a number of thin film layers (several nm to several tens of nm) forming the electrode film, has the following action in addition to the impurities each time when forming a thin film layer, the time required for the process can be shortened and the overall time of the process can be reduced. Also, the amount of the impurity drawn out becomes more complete.

The process for production of the present invention can be used for the step of forming a fine gate electrode film on a thin film gate insulating film of a thickness of for example less than 15 nm or less than 10 nm.

Note that along with miniaturization of gate electrodes, the gate insulating film is also being made thinner at 0.8 times of a miniaturization rate of gate electrodes. That is, the process of the present invention contributes not only to the formation of thinner gate insulating films but also to the miniaturization of gate electrodes.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

The present invention will be now explained in further detail with reference to preferred embodiments.

FIRST EMBODIMENT

Figure 1A:
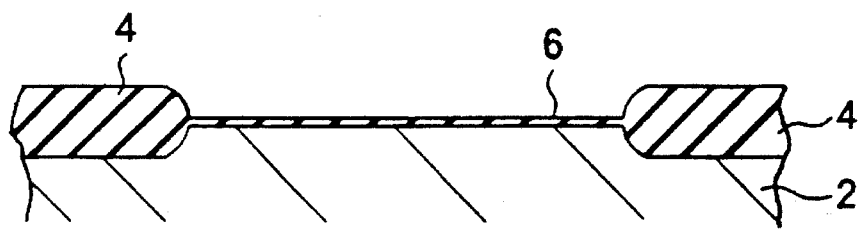
FIGS. 1A and 1B are cross-sectional views of the process for producing a semiconductor device according to a first embodiment of the present invention.

In a first embodiment of the process for production of a semiconductor device according to the present invention, as shown in FIG. 1A, first, a device-isolation region (LOCOS) 4 is formed by the selective oxidation method on the surface of the semiconductor substrate 2 along the device-isolation pattern. The semiconductor substrate 2 used is for example a single crystalline silicon substrate.

Next, a good quality gate insulating film 6 is formed by the thermal oxidation method on the surface of the semiconductor substrate 2 positioned between the areas of the LOCOS 4. In the present invention, this gate insulating film 6 is formed by a silicon oxide film. The thickness is not particularly limited, but for example may be made 10 nm or so.

Figure 1B:
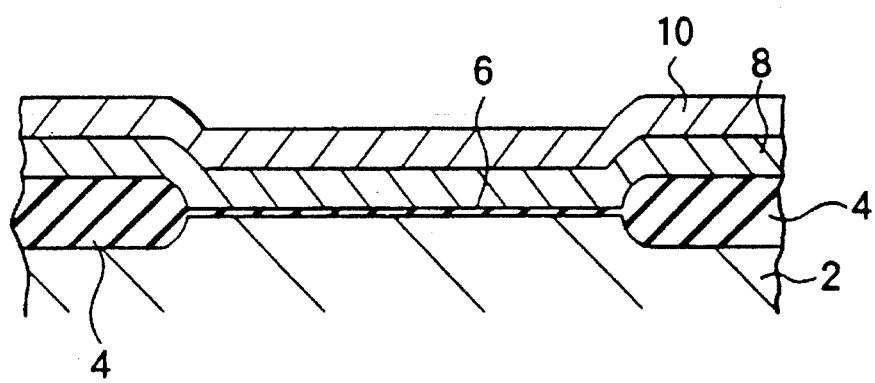

Next, in this embodiment, as shown in FIG. 1B, a polycrystalline silicon film 8 is formed by the CVD method on the surface of the LOCOS 4 and gate insulating film 6. To improve the conductivity of the polycrystalline silicon film 8, the polycrystalline silicon film 8 is doped with phosphorus (P). The doping of P can be performed at the time of the CVD, but also can be performed by ion implantation after the formation of the film. The thickness of this polycrystalline film 8 is not particularly limited, but for example can be about 100 to 250 nm.

Next, a silicide film 10 is formed on the polycrystalline silicon film 8. This silicide film 10 is for example comprised of a tungsten silicide film (WSi$_x$) and is formed by the CVD method using SiH$_4$+WF$_6$ gas. The temperature of the substrate at the time of the CVD is not particularly limited, but may for example be 380° C. The thickness of the silicide film 10 is not particularly limited, but may be 100 to 250 nm.

Figure 2:
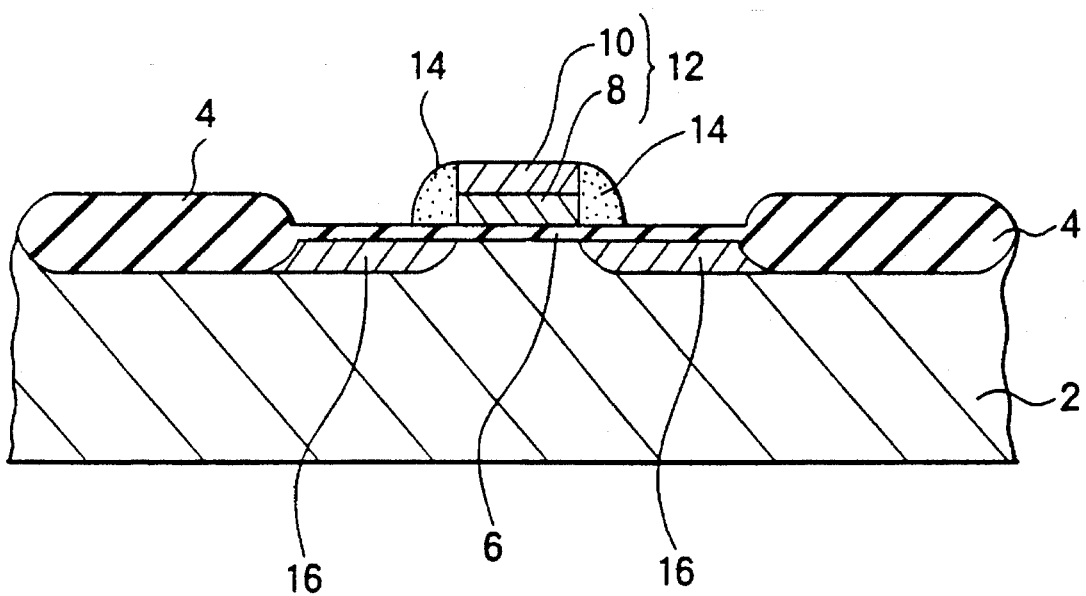
FIG. 2 is a cross-sectional view of the step after the process of production shown in FIGS. 1A and 1B.

The polycrystalline silicon film 8 and the silicide film 10 together form the polycide film. This polycide film is processed as shown in FIG. 2 to form the gate electrode 12.

Figure 5A:
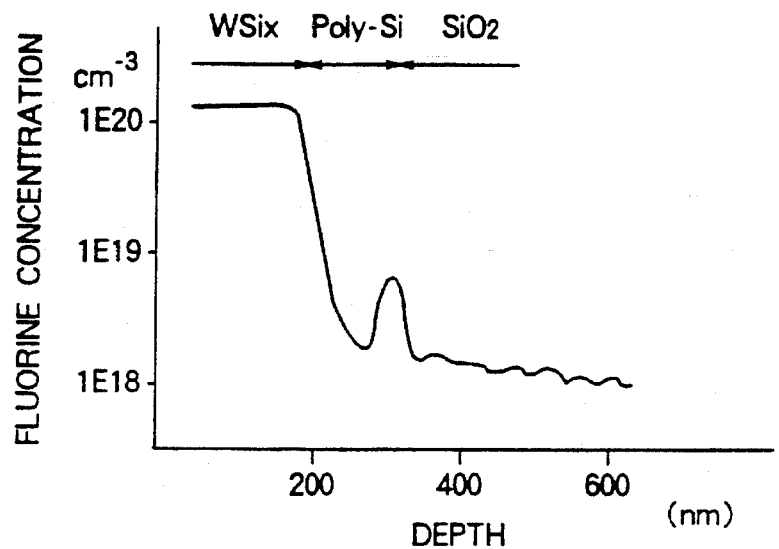
FIG. 5A is a graph of the results of measurement by a secondary ion mass spectrometer (SIMS) of the concentration of fluorine, directly after deposition, of a tungsten silicide ($WSi_x$) film deposited by monosilane gas on a silicon oxide film and polycrystalline silicon film
Figure 5B:
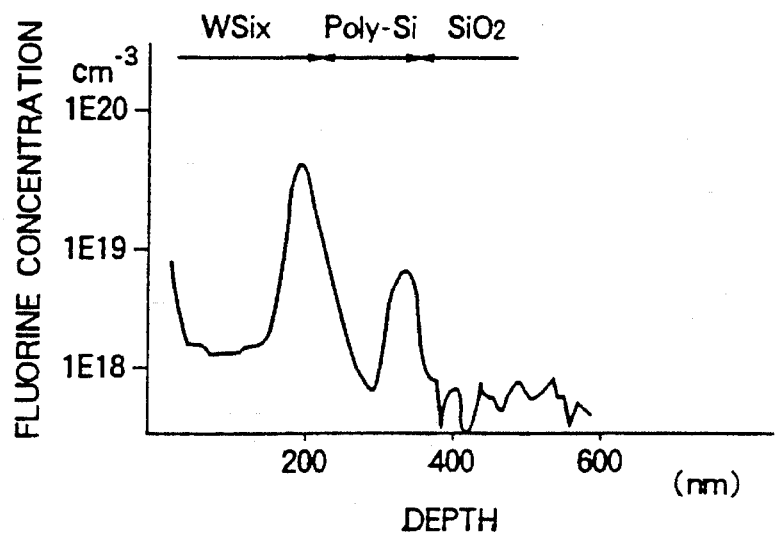
FIG. 5B is a graph of the results of measurement by a secondary ion mass spectrometer (SIMS) of the concentration of fluorine, directly after deposition, of a tungsten silicide ($WSi_x$) film deposited by a dichlorosilane (DCS) gas on a silicon oxide film and polycrystalline silicon.
Figure 6A:
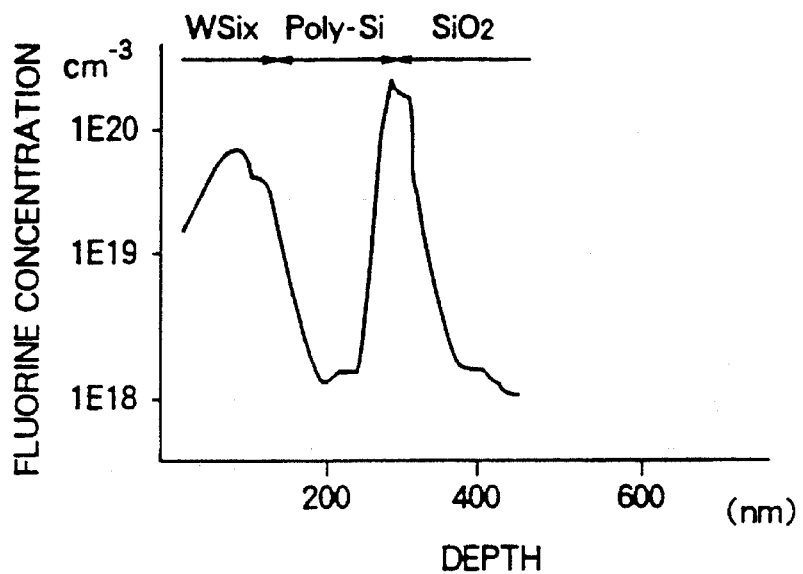
FIG. 6A is a graph of the results of measurement by a secondary ion mass spectrometer (SIMS) of the concentration of fluorine, after high temperature heat treatment, of a tungsten silicide (WSi$_x$) film deposited by a monosilane gas on a silicon oxide film and polycrystalline silicon film
Figure 6B:
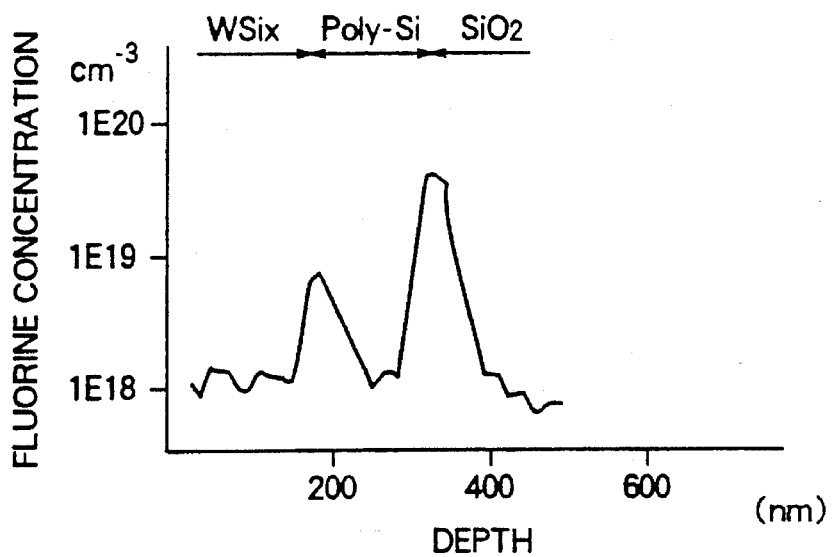
FIG. 6B is a graph of the results of measurements by a secondary ion mass spectrometer (SIMS) of the concentration of fluorine, after high temperature heat treatment, of a tungsten silicide (WSi$_x$) film deposited by a dichlorosilane (DCS) gas on a silicon oxide film and polycrystalline silicon.

Investigation of the concentration of the fluorine by the secondary ion mass spectrometer (SIMS) method just after deposition of the silicide film 10 shown in FIG. 1B revealed the distribution of concentration shown in FIG. 5A. In the prior art, heat treatment (for example, at a temperature of 700° C. or 800° C. or more) had been performed for activation of the polycrystalline silicon film 8 after deposition of the silicide film 10 for the purpose of annealing to lower the resistivity. As a result, as shown in FIG. 6A, the fluorine moved and piled up at the interface of the silicon oxide film (corresponding to gate insulating film 6), promoted enhanced oxidation of the silicon oxide film, and caused an increase in the thickness of the silicon oxide film.

In this embodiment, preliminary heat treatment is performed under the following conditions before this annealing to lower the resistivity so as to draw out the fluorine contained as impurities in the silicide film 10 and/or polycrystalline silicon film 8 and/or gate insulating film 6.

This preliminary heat treatment is not particularly limited so long as the temperature is more than the film-forming temperature of the silicide film 10 and less than the film-forming temperature of the gate insulating film 6, but for example is performed at 450° C. to 800° C., preferably 450° C. to 700° C. Further, as the gas of the gas atmosphere of the heat treatment, use is made of argon or other inert gases, nitrogen gas, hydrogen gas, etc. The ambient pressure during the heat treatment is atmospheric pressure or a vacuum. Further, the heat treatment time is for example 5 to 120 minutes.

By this preliminary heat treatment, it is possible to draw out the fluorine present as impurities in the silicide film 10 and/or polycrystalline silicon film 8 and/or gate insulating film 6. Further, this heat treatment is conducted at a relatively low temperature (less than 800° C., preferably less than 700° C.), so there is almost no enhanced oxidation of the gate insulating film, that is, the silicon oxide film.

Next, in this embodiment, the annealing for lowering the resistivity is performed for activating the polycrystalline silicon layer 8. This annealing to lower the resistivity is for example performed at a temperature of over 700° C. or over 800° C. After this, the same type of process as in the related art is followed to form an MOS transistor.

That is, as shown in FIG. 2, the silicide film 10 and the polycrystalline silicon film 8 are etched to a predetermined pattern, a gate electrode film 12 is formed, side walls 14 are formed at the side portions of the gate electrode film 12, and a source-drain region 16 is formed on the surface of the semiconductor substrate 2 in a self-aligning manner with the gate electrode film 12. The source-drain region 16 is formed by an ion implantation method and for example has an LDD (Lightly Doped Drain) construction.

Figure 3:
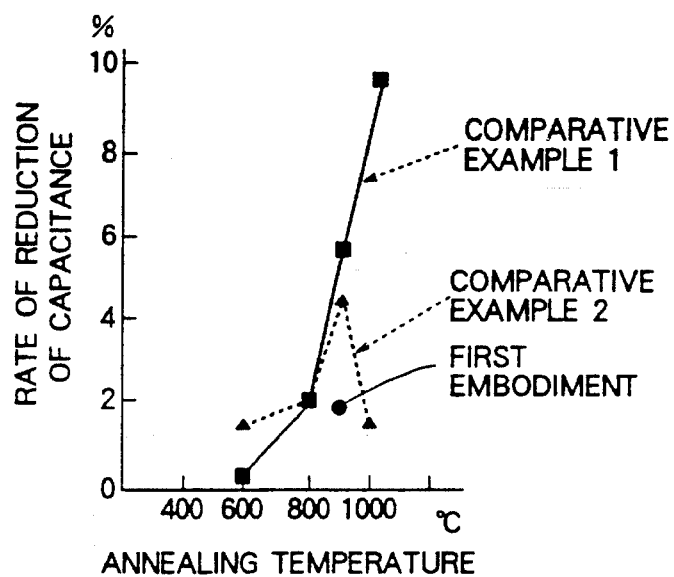
FIG. 3 is a graph showing the rate of reduction of the capacitance of an MOS transistor obtained by the process of production of a semiconductor device according to the first embodiment of the present invention in comparison with a related art.

The rate of the reduction of the capacitance of the gate insulating film 6 in the MOS transistor obtained by the process for production of this embodiment (rate of increase of thickness of gate insulating film after annealing to lower the resistivity just after deposition) is shown by the black dots in FIG. 3. In the first embodiment, it was confirmed that the rate of reduction of the capacitance (rate of increase of the thickness of the gate insulating film) could be made 2 to 4 percent or so.

In the first embodiment shown in FIG. 3, the preliminary heating was heat treatment at 600° C. for 60 minutes in a nitrogen atmosphere. The target thickness of the gate insulating film was 11 nm. The temperature of the annealing to lower the resistivity was 900° C.

Note that FIG. 3 shows as Comparative Example 1 the results of measurement of the rate of reduction of the capacitance of comparative MOS transistors, prepared in the same way as in the first embodiment except that no preliminary heat treatment was performed, for different temperatures of annealing to lower the resistivity. That is, in Comparative Example 1, the rate of reduction of the capacitance (rate of increase of thickness) was more than 5 percent after annealing to lower the resistivity at 900°0 C.

Further, FIG. 3 shows as Comparative Example 2 the results of measurement of the rate of reduction of the capacitance of comparative MOS transistors, prepared in the same way as in the first embodiment except for forming the tungsten silicide film by a dichlorosilane (DCS) gas and not performing preliminary heat treatment, for different temperatures of annealing to lower the resistivity. That is, in Comparative Example 2, the rate of reduction of the capacitance (rate of increase of thickness) was more than 4 percent after annealing to lower the resistivity at 900° C. Note that in tungsten silicide films formed using a dichlorosilane (DCS) gas, there was a large manufacturing variation and there would be great difficulties in using them for actual manufacturing processes.

Figure 4:
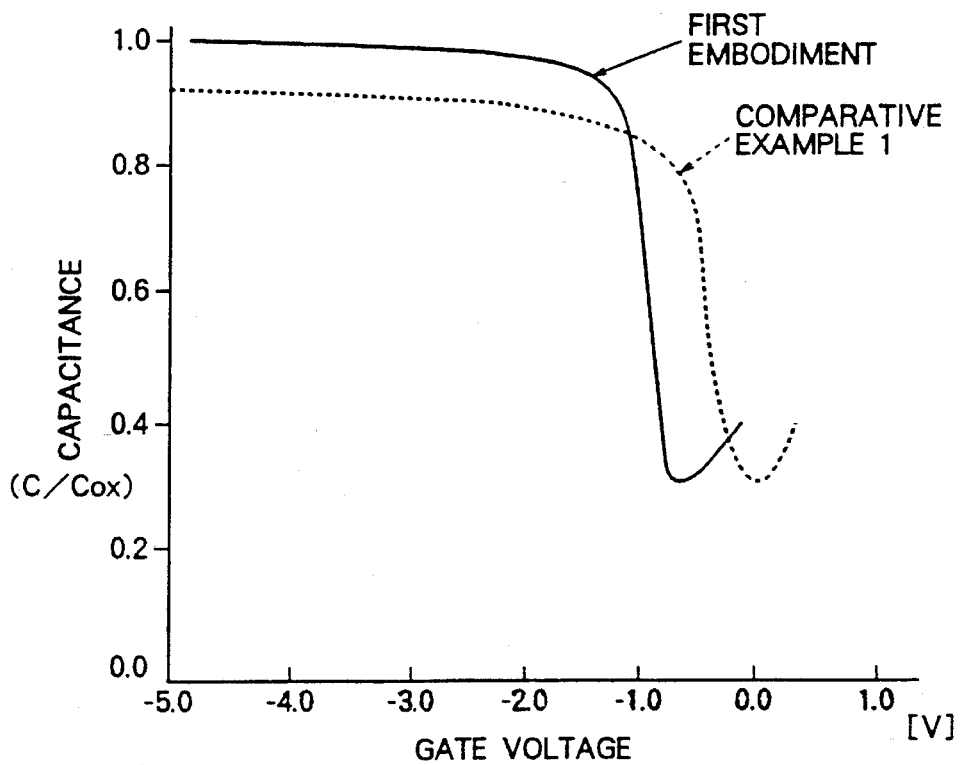
FIG. 4 is a graph showing the rate of change of the capacitance to the gate voltage of an MOS transistor obtained by the process for production according to the first embodiment of the present invention.

The solid line in FIG. 4 shows the rate of change of the capacitance with respect to the gate voltage in an MOS transistor obtained by the process for production according to the first embodiment of the present invention (C-V measurement data). Further, FIG. 4 shows by the dotted line as Comparative Example 1 the results of measurement of the C-V characteristic of an MOS transistor prepared in the same way as the first embodiment except not performing the preliminary heat treatment and with the same thickness of the gate insulating film as in the first embodiment.

SECOND EMBODIMENT

Figure 1C:
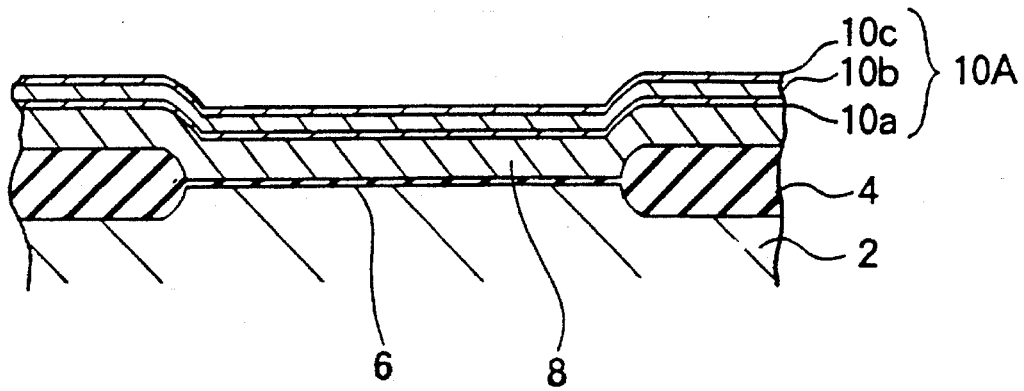
FIG. 1C is a cross-sectional view of a part of the process for producing a semiconductor device according to another embodiment of the present invention.

Next, an explanation will be made of a second embodiment. An MOS transistor was manufactured in the same way as in the first embodiment except that a silicide film was formed under the following conditions:

As shown in FIG. 1C, after the polycrystalline silicon film 8 was formed, one or more silicide thin film layers 10a of several nm to several tens of nm were formed by the CVD method using silane gas. Next, the residual fluorine was removed by degassing by means of performing preliminary heat treatment or plasma treatment under the following conditions.

The temperature for the preliminary heat treatment was 450° C. to 700° C. As the ambient gas, use was made of inert nitrogen or argon gas or hydrogen gas. Further, there may be plasma ions in the atmosphere. The ambient pressure was atmospheric pressure or a vacuum (reduced pressure). From the viewpoint of degassing, a vacuum is preferable. The treatment time was 1 second to 120 minutes.

Next, one or more silicide thin film layers 10b of several nm to several tens of nm thickness were formed in the same way as the silicide thin film layers 10a, then the residual fluorine was removed by degassing by means of preliminary heating or plasma treatment under the above conditions once again. This step was performed in the same way for the silicide thin film layers 10c or succeeding thin film layers to finally obtain the silicide layer 10A of the predetermined thickness.

Next, annealing to lower the resistivity was performed on the polycrystalline silicon layer 8 and then the same procedure was followed as in the first embodiment to form an MOS transistor.

In the second embodiment, when forming the silicide layer 10A, since successive preliminary heat treatment or plasma treatment was performed after each forming one or more silicide thin film layers 10a, 10b, and 10c, the treatment for removing the residual fluorine as a gas from the thin film layers could be completed in a short time and the time for the process as a whole could be shortened as well. Further, since the degassing was performed from thin film layers, the degassing treatment became more complete.

THIRD EMBODIMENT

Next, an explanation will be made of a third embodiment. An MOS transistor was manufactured in the same way as in the first embodiment except that a silicide film was formed under the following conditions:

As shown in FIG. 1C, after the polycrystalline silicon film 8 was formed, a single silicide thin film layer 10a of several nm to several tens of nm was formed by the CVD method using silane gas. Next, the residual fluorine was removed by degassing by means of performing preliminary heat treatment or plasma treatment under the following conditions.

The temperature for the preliminary heat treatment was 450° C. to 700° C. As the ambient gas, use was made of inert nitrogen and/or argon gas and/or helium gas and/or hydrogen gas plus monosilane and/or polysilane. Further, there may be plasma ions in the atmosphere. The ambient pressure was atmospheric pressure or a vacuum. From the viewpoint of degassing, a vacuum is preferable. The treatment time was 1 second to 120 minutes.

Next, a single silicide thin film layer 10b of several nm to several tens of nm thickness was formed in the same way as the silicide thin film layer 10a, then the residual fluorine was removed by degassing by means of preliminary heating or plasma treatment under the above conditions once again. This step was performed in the same way for the silicide thin film layer 10c or succeeding thin film layers to finally obtain the silicide layer 10A of the predetermined thickness.

Next, annealing to lower the resistivity was performed on the polycrystalline silicon layer 8 and then the same procedure was followed as in the first embodiment to form an MOS transistor.

In the third embodiment, when forming the silicide layer 10A, since successive preliminary heat treatment or plasma treatment was performed after forming single silicide thin film layers 10a, 10b, and 10c, the treatment for removing the residual fluorine as a gas from the thin film layers could be completed in a short time and the time for the process as a whole could be shortened as well. Further, since the degassing was performed from thin film layers, the degassing treatment became more complete.

While the invention has been described by reference to specific embodiments chosen for purposes of illustration, it should be apparent that numerous modifications could be made thereto by those skilled in the art without departing from the basic concept and scope of the invention.

For example, the above embodiments were explained with reference to a gate electrode film as the electrode film, but the present invention is not limited to that. It can be widely used as a technique for preventing enhanced oxidation of an insulating film when forming an electrode film, other than a gate electrode film, containing fluorine or other impurities on an insulating film. Further, the electrode film is not limited to a polycide film. Also, the insulating film is not limited to a silicon oxide film and may also be multilayer film of an ONO ($SiO_2/Si_3N_4/SiO_2$) film or other silicon oxide film and silicon nitride film.

As explained above, according to the present invention, there is no longer any enhanced oxidation of the insulating film due to fluorine and other impurities and it is possible to prevent the increase in thickness of the insulating film.

Since it is possible to prevent an increase in thickness of the insulating film after the formation of the electrode film, it is possible to maintain the thickness of the insulating film during its formation, it is easy to control the thickness of the insulating film, and it is possible to form the insulating film with a high precision. Further, for the same reasons, it is possible to maintain the thickness of the insulating film at the time of forming a good quality film (one superior in voltage resistance), so the voltage resistance can be improved and an insulating film superior in reliability can be formed.

Further, since there is no longer escape of fluorine and other impurities as a gas at the time of heat treatment for activation of the electrode film, it is possible to prevent the phenomenon of peeling of the electrode film. As a result, it is possible to reduce the manufacturing defects and therefore to expect a higher manufacturing yield.

In addition, since it is possible to form the electrode film by the CVD method using a monosilane type gas rather than using dichlorosilane etc., it is possible to produce the electrode film stably at a high quality.

In the other aspect of the present invention, which draws out the impurities during the formation of the electrode film, after each formation of the number of thin film layers (several nm to several tens of nm) forming the electrode film, by performing preliminary heat treatment or other step for drawing out the impurities each time when forming a thin film layer, the time required for the process can be shortened and the overall time of the process can be reduced. Also, the amount of the impurity drawn out becomes more complete.

The process of the present invention can be preferably used for a step for forming a fine gate electrode film on a thin film gate insulating film of for example less than 15 nm or less than 10 nm. Note that along with miniaturization of gate electrodes, the gate insulating film is also being made thinner at 0.8 times of a miniaturization rate of gate electrodes. That is, the process of the present invention contributes not only to the formation of thinner gate insulating films but also to the miniaturization of gate electrodes.

We claim:

1. A process for producing a semiconductor device comprising steps of:

forming a polycide electrode film on an insulating film;

drawing out impurities which are contained in at least one of the electrode film and insulating film which contribute to the growth of the insulating film during annealing at a temperature for activating the electrode film, said drawing out of said impurities comprising heat treating said electrode film and said insulating layer at a temperature between about 450° and about 800° C.; and annealing said electrode at a temperature of over about 800° C. film to activate said electrode film.

2. The process for producing a semiconductor device as set forth in claim 1, wherein fluorine is drawn out as one of the impurities.

3. The process for producing a semiconductor device as set forth in claim 1, wherein the preliminary heat treatment is perforated in a gaseous atmosphere including any one from the group consisting of hydrogen, silane and polysilane.

4. The process for producing a semiconductor device as set forth in claim 1, wherein the preliminary heat treatment is performed at a pressure of atmospheric pressure to vacuum.

5. The process for producing a semiconductor device as set forth in claim 1, wherein the step of drawing out the impurities is a step of plasma treatment of the surface of the electrode film by using any one gas of the group consisting of the group consisting of hydrogen, silane and polysilane.

6. The process for producing a semiconductor device as set forth in claim 1, wherein fluorine is drawn out as one of the impurities.

7. A process for producing a semiconductor device comprising the steps of:

forming a polycide electrode film on an insulating film;

heat treating said polycide film and insulating film at a temperature no less than the film-forming temperature of the electrode film and no more than the growth temperature of the insulating film, thereby to draw out impurities that would otherwise contribute to growth of the insulating film during an annealing step carried out at no less than said growth temperature of said insulating film; and annealing said electrode film at no less than said growth temperature of said insulating film.

8. The process for producing a semiconductor device as set forth in claim 7, wherein the preliminary heat treatment is performed in a gaseous atmosphere including any one from the group consisting of hydrogen, silane and polysilane.

9. The process for producing a semiconductor device as set forth in claim 8, wherein the preliminary heat treatment is performed at a pressure of atmospheric pressure to vacuum.

10. The process for producing a semiconductor device as set forth in claim 7, wherein the preliminary heat treatment is performed at a temperature of 450° C. to 800° C.

11. The process for producing a semiconductor device as set forth in 7, wherein the step of drawing out the impurities is a step of plasma treatment of the surface of the electrode film by using any one gas selected from the group consisting of hydrogen, silane, and polysilane.

12. The process for producing a semiconductor device as set forth in claim 7, wherein the step of drawing out the impurities is performed after the formation of the electrode film.

13. The process for producing a semiconductor device as set forth in claim 7, wherein the electrode film comprises a plurality of thin film layers and the step of drawing out the impurities is performed during the formation of the electrode film after each formation of each thin film layer of the electrode film.

14. The process for producing a semiconductor device as set forth in claim 7, wherein the step of drawing out the impurities is performed after the formation of the electrode film.

15. The process for producing a semiconductor device as set forth in claim 7, wherein the electrode film comprises a plurality of thin film layers and the step of drawing out the impurities is performed during the formation of the electrode film after the formation of each thin film layer of the electrode film.

* * * * *